United States Patent [19]
Hatano et al.

[11] Patent Number: 6,104,088
[45] Date of Patent: Aug. 15, 2000

[54] COMPLEMENTARY WIRING PACKAGE AND METHOD FOR MOUNTING A SEMI-CONDUCTIVE IC PACKAGE IN A HIGH-DENSITY BOARD

[75] Inventors: Hiromitsu Hatano, Hdano; Akira Yashiro, Atsugi, both of Japan

[73] Assignee: Ricoh Company, Ltd., Tokyo, Japan

[21] Appl. No.: 09/094,613

[22] Filed: Jun. 15, 1998

[30] Foreign Application Priority Data

Jun. 13, 1997 [JP] Japan ..................................... 9-156440
Oct. 20, 1997 [JP] Japan ..................................... 9-286783

[51] Int. Cl.[7] ................................................... H01L 23/04
[52] U.S. Cl. ......................... 257/698; 257/685; 257/686
[58] Field of Search .................................. 257/777, 778, 257/698, 686, 685

[56] References Cited

U.S. PATENT DOCUMENTS

| 3,648,131 | 3/1972 | Stuby . |
| 4,074,342 | 2/1978 | Honn et al. . |
| 5,521,435 | 5/1996 | Mizukoshi . |
| 5,640,051 | 6/1997 | Tomura et al. . |
| 5,847,936 | 12/1998 | Forehand . |

*Primary Examiner*—Sheila V. Clark
*Attorney, Agent, or Firm*—Oblon, Spivak, McClelland, Maier & Neustadt, P.C.

[57] ABSTRACT

A complementary wiring package including a package, a first set of external pins mounted in a central region on a top surface of the package in a vertical direction and connected to a plurality of respectively corresponding through holes, a second set of external pins being mounted in a perimeter region on a top surface of the package in a vertical direction and connected to printed wiring of a printed wiring board, and a plurality of internal lines that connect the first set of external pins to the second set of external pins. The complementary wiring package does not require a semi-conductor integrated circuit and is capable of being coupled with an semi-conductor integrated circuit package via the plurality of respectively corresponding through holes of the printed wiring board which is sandwiched between the complementary wiring package and the semi-conductor integrated circuit package.

18 Claims, 12 Drawing Sheets

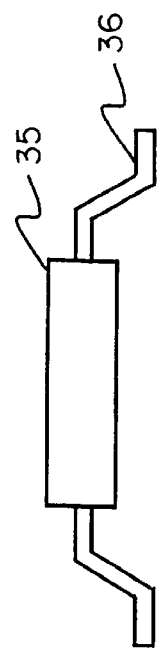
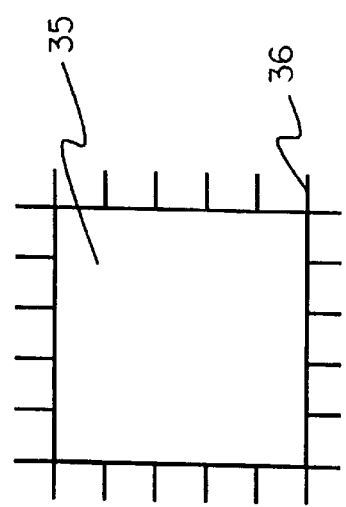
Fig. 9(a)
Fig. 9(b)
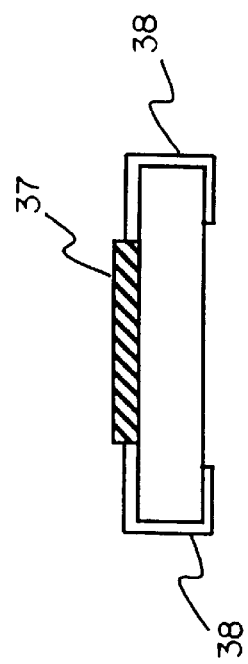
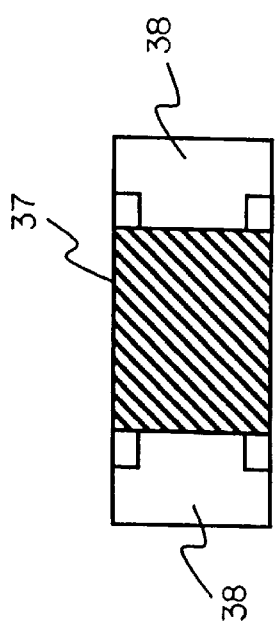
Fig. 10(a)
Fig. 10(b)

COMPLEMENTARY WIRING PACKAGE AND METHOD FOR MOUNTING A SEMI-CONDUCTIVE IC PACKAGE IN A HIGH-DENSITY BOARD

BACKGROUND OF THE INVENTION

1. Field of the Invention

This invention relates to a complementary wiring package and a method for mounting a semi-conductive integrated circuit package. More particularly this invention relates to a complementary wiring package that includes only external pins and internal connecting lines and to a method for mounting a semi-conductive integrated circuit package on a high-density board using the complementary wiring package.

2. Discussion of the Background

Semi-conductor integrated circuits have been miniaturized in response to the increasing demands for downsizing. For example, the ball grid array (BGA) and the chip size package (CSP) have been developed.

However, the development of printed wiring boards has not kept pace with developments in the miniaturization of semi-conductor integrated circuits. As downsizing of the packages of semi-conductor integrated circuits progresses, the number of pins of the semiconductor integrated circuit package becomes a serious problem.

When a large number of pins are mounted on the bottom surface of a semi-conductor integrated circuit package mounted on a conventional printed wiring board, all the pins must be arranged on the perimeter of the bottom surface of the package. This arrangement is necessary to permit connection of the pins to external circuitry. If the pins are arranged in a central region of the bottom surface, for example, signal lines from these pins may not be able to reach the external circuitry.

FIG. 12(a) illustrates an exemplary pin (external bump) configuration of a typical BGA or CSP package 41 described above in which a plurality of external bumps 42 are arranged on a perimeter, but not in a central region, of the bottom surface of the package 41. The external bumps 42 are arranged in four banks, as illustrated in FIG. 12(b), in which two adjacent external bumps in the same bank are spaced 0.8 mm apart, for example. As illustrated in FIG. 12(c), a printed wiring board 48 having a multi-layer configuration has a signal lead 43 on a surface layer 44 for connecting to the external bumps 42 in the first and second banks. The printed wiring board 48 also has a signal lead 45 on a second layer 46 for connecting to the external bumps 42 in the third and fourth banks through a through hole 47 provided to connect the surface layer 44 to the second layer 46. A plurality of dotted circles 42a of FIG. 12(b) represent external bumps that are hypothetically added to the package 41. A through hole 47a of FIG. 12(c) is hypothetically added in order to connect the external bumps 42a to a third layer, for example.

Generally, the above-mentioned printed wiring board 48 can be fabricated by first providing the through holes 47 for connecting the surface layer 44 and the second layer 46 and then adding additional layers (unnumbered). However, having additional through holes 47a makes the fabrication of the board 48 difficult. In this case, through the fabrication step of adding the additional layers, a metal plating layer (not shown) on the surface layer 44 becomes so thick that the wiring on the package 41 can not be implemented. Therefore, a commercially feasible printed wiring board 48 having a plurality of different through holes 47 and 47a has not been fabricated in the above-described way.

Although the so-called "build-up method" has been developed in order to arrange external bumps in the central region of the bottom of the package, fabrication by this method is not practical due to its high manufacturing cost and unpredictable manufacturing quality. FIG. 13 illustrates the build-up method. A multi-layer printed wiring board 51 is configured to have through holes 52, 52a and 52b for connecting to the second layer 56b, the third layer 56c and the fourth layer 56d, respectively. In FIG. 13, reference numerals 53 and 54 denote signal leads disposed on the surface layer 56a and the second layer 56b, respectively. Reference numeral 55 denotes a BGA package, for example.

Also, when a high-density circuit board is designed using semi-conductor integrated circuits, the printed wiring on the board is usually dense. As a result, the printed wiring for connecting components may not be arranged with an appropriate spacing therebetween, and the layout of components may need to be rearranged. Furthermore, the printed wiring board may need to be redesigned in order to reduce the wiring density. All these factors may increase the cost of fabrication.

With regard to the shape of the printed wiring board, the standard rectangle shape is often replaced with a unique shape. This change is due to various restrictions, including a mechanical space problem. As a result of making uniquely shaped boards, some portions of the boards are made useless and wasted.

Conventional wiring techniques for printed wiring boards are described, for example, in Japanese Unexamined Patent Application Nos. JPAP58-153391(1983) and JPAP1-71102 (1989), both of which are herein incorporated by reference in their entirety.

SUMMARY OF THE INVENTION

Accordingly, one object of the present invention is to provide a novel complementary wiring package that obviates the drawbacks of the conventional wiring packages discussed above.

Another object of the present invention is to provide a novel method for mounting a semi-conductive integrated circuit package on a high-density printed wiring board while avoiding the drawbacks of the conventional wiring packages discussed above.

These and other objects of the present invention are achieved by providing an apparatus and a method wherein a complementary wiring package that includes no semi-conductor integrated circuit is capable of being coupled with an semi-conductor integrated circuit package via a plurality of respectively corresponding through holes in a printed wiring board. The printed wiring board is sandwiched between the complementary wiring package and the semi-conductor integrated circuit package. The complementary wiring package includes a first set of external pins mounted in a central region on a top surface of the complementary wiring package in a vertical direction and connected to respective of the plurality of through holes, a second set of external pins mounted in a perimeter region on a top surface of the package in a vertical direction and connected to printed wiring of the printed wiring board, and a plurality of internal lines that connect the first set of external pins to the second set of external pins.

According to the novel method of the present invention, a method for mounting a semi-conductor integrated circuit package having a plurality of external pins onto a top surface of a printed wiring board is provided. The method includes the steps of selecting external pins that are incapable of being connected to other circuits by the print wiring mounted on the surface and second layers of the printed wiring board, mounting a plurality of through holes in the printed wiring board in positions corresponding to the external pins selected by the selecting step, connecting the external pins selected by the selecting step to the plurality of through holes mounted in corresponding positions, and arranging connections of the plurality of through holes to other circuits on a bottom surface of the printed wiring board.

Other objects, features, and advantages of the present invention will become apparent from the following detailed description when read in conjunction with the accompanying drawings.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIGS. 9(a) and 9(b) illustrate a variation of the semi-conductive integrated circuit package of FIG. 8;

FIGS. 10(a) and 10(b) illustrate a variation of a square chip resistor;

DESCRIPTION OF THE PREFERRED EMBODIMENTS

Figure 1:
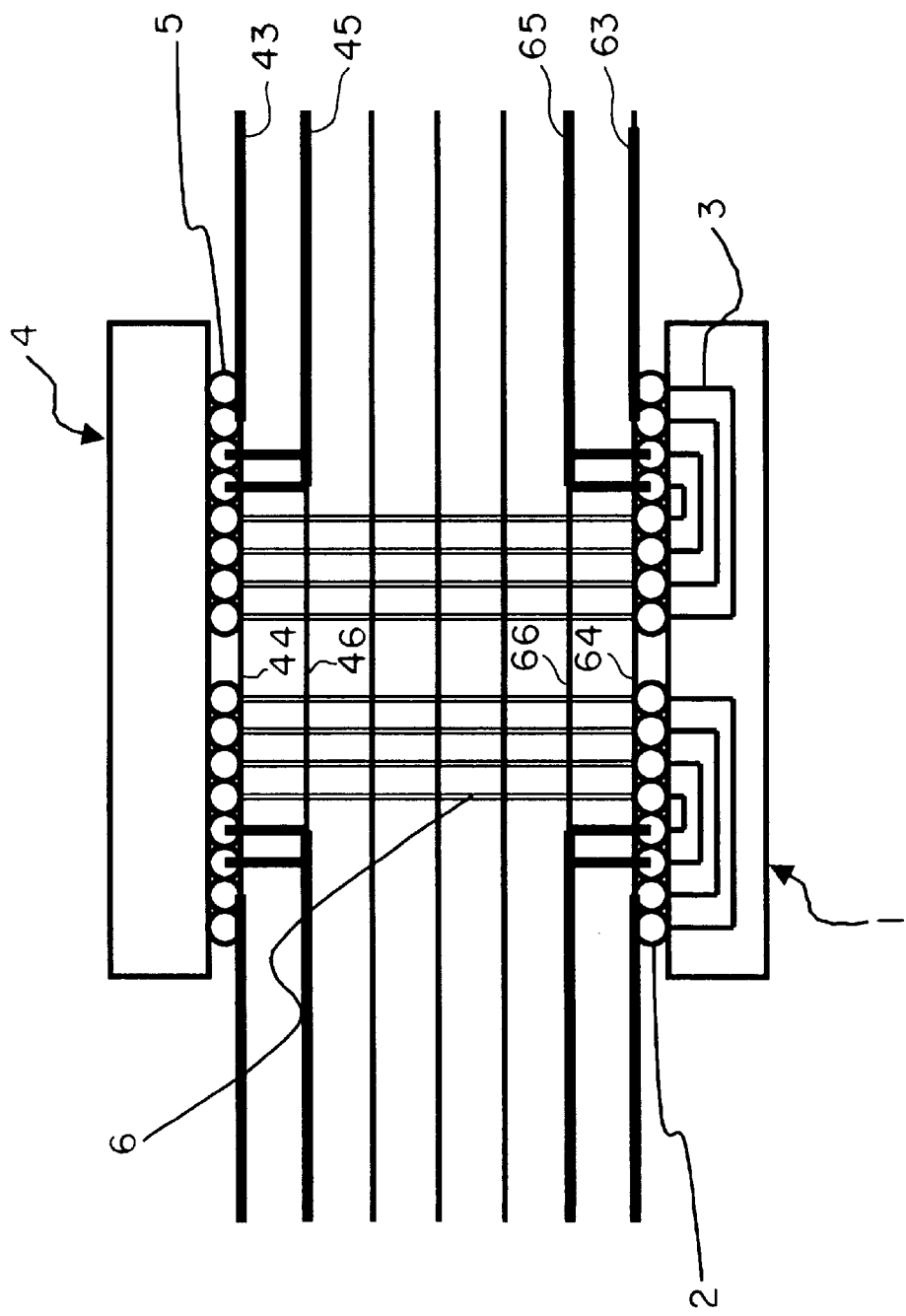
FIG. 1 is a sectional view of a complementary wiring package mounted opposite a semi-conductive integrated circuit package relative to a printed wiring board according to a first embodiment of the present invention.

Referring now to the drawings, wherein like reference numerals designate identical or corresponding parts throughout the several views, and more particularly to FIG. 1 thereof, a complementary wiring package 1 is mounted on a multi-layer printed wiring board (unnumbered) according to a first embodiment of the present invention. The complementary wiring package 1 is an externally-molded package and disposed opposite a multi-pin configured IC (integrated circuit) package 4. The printed wiring board is sandwiched between the complementary wiring package 1 and the IC package 4, as illustrated in FIG. 1. The complementary wiring package 1 includes a plurality of external bumps 2 in a central region (central region external bumps) as well as on a perimeter of the upper surface thereof (perimeter external bumps). The complementary wiring package 1 also includes a plurality of internal leads 3. The IC package 4 includes a plurality of external bumps 5 on a perimeter (perimeter external bumps) and in a central region (central region external bumps) of the bottom surface of the IC package 4. The perimeter external bumps 5 on the of the bottom surface of the IC package 4 can be connected to the corresponding leads 43 and 45 on either the surface layer 44 or second layer 46 of the board in a conventional manner.

As illustrated in FIG. 1, the printed wiring board includes a plurality of through holes 6 arranged to correspond to the central region external bumps 5 of the IC package 4. The central region external bumps 2 of the complementary wiring package 1 are arranged to correspond to the central region external bumps 5 of the IC package 4 via corresponding through holes 6. In the complementary wiring package 1, the central region external bumps 2 are connected to corresponding perimeter external bumps 2 on a one-to-one basis by the internal leads 3. The complementary wiring package 1 includes no semi-conductor integrated circuits.

With the complementary wiring package described above, a signal from a central region external bump 5 of the IC package 4 can be sent to other circuits using a lead 63 or 65 on either the bottom surface 64 or the next-to-bottom layer 66 of the printed wiring board. An electrical connection is formed through the corresponding through hole 6, the corresponding central region external bump 2, the internal leads 3 and the corresponding perimeter external bump 2 of the complementary wiring package 1, as illustrated in FIG. 1.

The above-mentioned through holes 6 can be mounted in the multi-layer printed wiring board using conventional techniques.

Next, a second embodiment of the present invention that includes a complementary wiring package 11 is explained with reference to FIG. 2. The complementary wiring package of the second embodiment includes a plurality of external bumps 12 only in a central region of the upper surface thereof, a plurality of internal leads 13 and a plurality of horizontally extended external leads 14. Each of the external bumps 12 is connected to a corresponding external lead 14 by a corresponding internal lead 13. The complementary wiring package 11 includes no semi-conductor integrated circuits.

Figure 2:
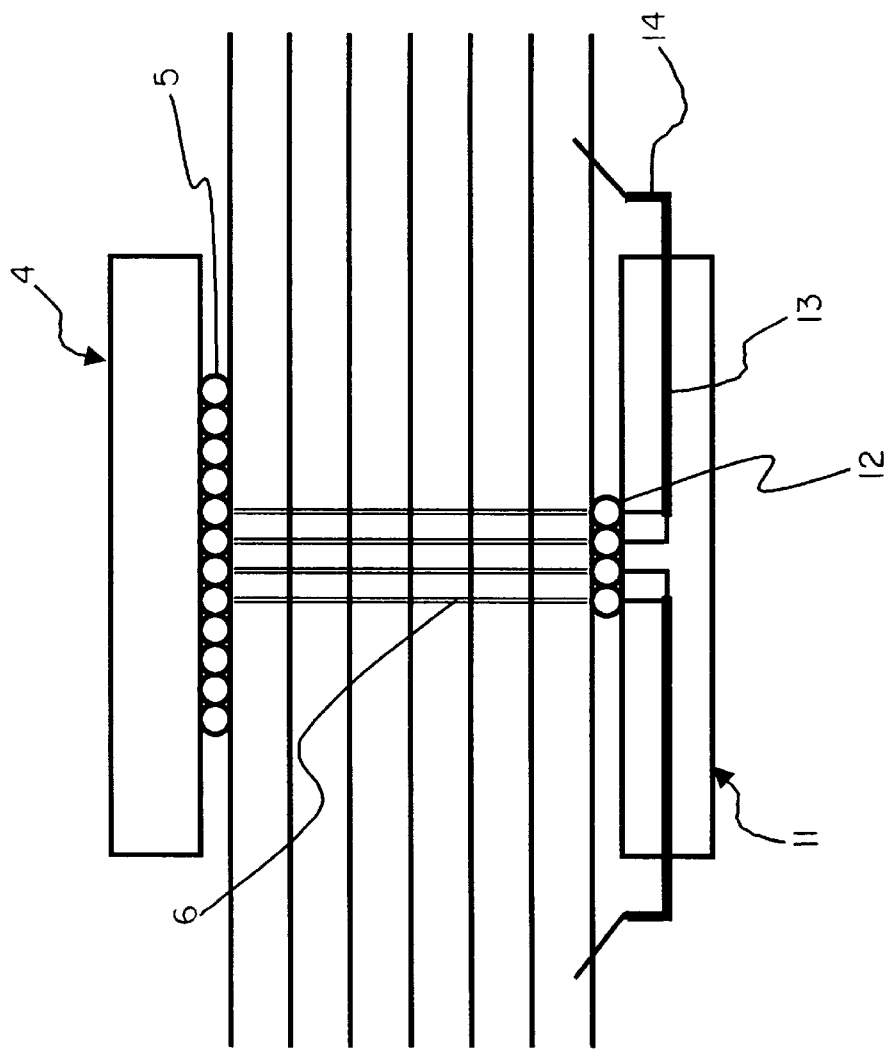
FIG. 2 is a sectional view of a complementary wiring package mounted opposite a semi-conductive integrated circuit package relative to a printed wiring board according to a second embodiment of the present invention.

With the complementary wiring package described above, a signal at a central region external bump 5 of the IC package 4 can be sent to other circuits using a lead on either the bottom surface or the next-to-bottom layer (unnumbered) of the printed wiring board, through the corresponding through hole 6, the corresponding external bump 12, the internal leads 13, and the external leads 14 of the complementary wiring package 1, as illustrated in FIG. 2.

The above-described complementary wiring packages 1 and 11, illustrated in FIGS. 1 and 2, respectively, have the following common advantageous effects.

1. To increase the number of pins mounted on the bottom surface of the IC package, the IC package is usually made larger because the pins can only be mounted on the perimeter of the IC package. However, the complementary wiring package according to the present invention is capable of connecting to central region external bumps of the IC package via through holes; therefore, a larger number of external bumps can be mounted on the same-sized IC package. As a result, the total space of the components may be reduced. The complementary wiring package includes no semi-conductor integrated circuit and can be fabricated in an easy and low cost manner.

2. The internal leads may be formed using a silicon material so as to easily handle the precise wiring configuration.

3. The complementary wiring package can be designed in a space saving manner since all the external bumps are arranged only one surface thereof.

4. The complementary wiring package has a number of pins aligned horizontally on one surface in order to correspond to all the pins of existing IC packages, so that all the pins of the IC packages can be connected to the external leads of the complementary wiring package.

5. The external leads of the complementary wiring package may be formed using solder. Therefore, the complementary wiring package can be fabricated easily and inexpensively using conventional techniques.

6. The external leads of the complementary wiring package may be formed using an electrically conductive adhesive. Therefore, the complementary wiring package can be fabricated easily and inexpensively using the conventional technique, with less lead.

7. The complementary wiring package has an ancillary heatsink effect in which heat from the IC package is dissipated into the atmosphere through the through holes.

Additionally, the entire IC mount structures illustrated in FIGS. 1 and 2 have the following advantageous effects.

1. In these structures, the wiring configuration can be implemented with conventional printed wiring board techniques because the complementary wiring package can connect the central region external bumps of the IC package without requiring through holes that extend through more than one layer, but not across the entire thickness, of the board.

2. The complementary wiring package is disposed opposite the IC package relative to the position of the printed wiring board, and therefore, both packages can be easily connected with each other with only the through holes. Therefore, the foot print of each component can be reduced, and thus, the size of the entire structure can be minimized. In general, if the number of pins of an IC package is doubled, the foot print of the IC package is squared. By using the complementary wiring package, the foot print is merely doubled when the number of pins is doubled. Also, by using the complementary wiring package, the printed wiring board does not need dense wiring only on one side thereof.

3. The complementary wiring package is disposed opposite the IC package relative to the printed wiring board, and therefore, both packages can be easily connected with each other with only the through holes. Accordingly, the size of the entire structure can be reduced.

4. The complementary wiring package is disposed opposite the IC package relative to the printed wiring board and is capable of receiving contacts from all the external bumps of the IC package, through the through holes.

Figure 3:
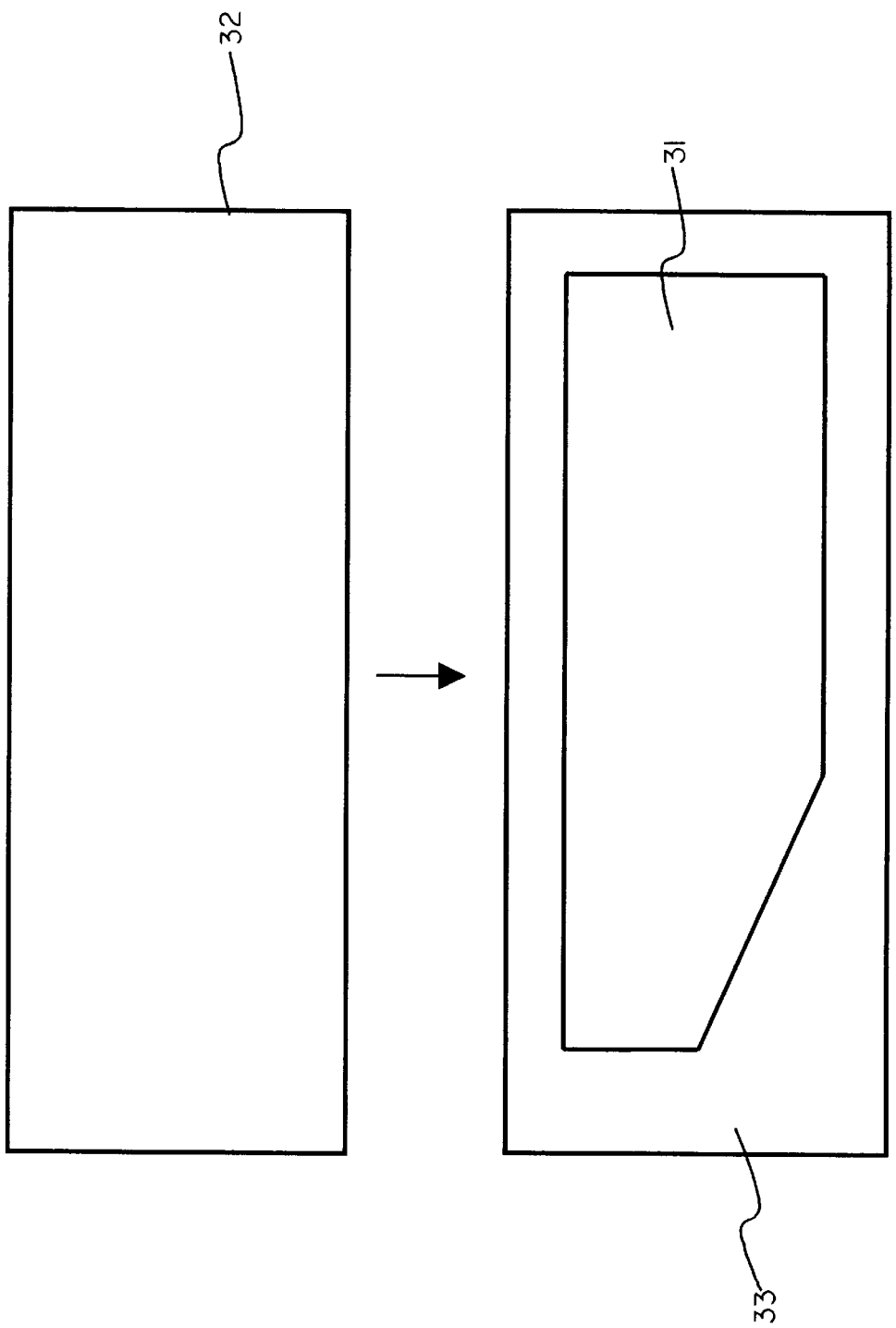
FIG. 3 is an illustration of a base board and a uniquely-shaped printed wiring board.

Next, a third embodiment of the present invention that includes a complementary wiring package 21 is explained with reference to FIGS. 3 through 6. As explained earlier, there is a recent tendency to design printed wiring boards having unique shapes. FIG. 3 illustrates an example of a uniquely shaped board 31, a base board 32, and a wasted portion 33. In general, the uniquely shaped board 31 is made by cutting the base board 32 and disposing of the wasted portion 33.

Figure 4:
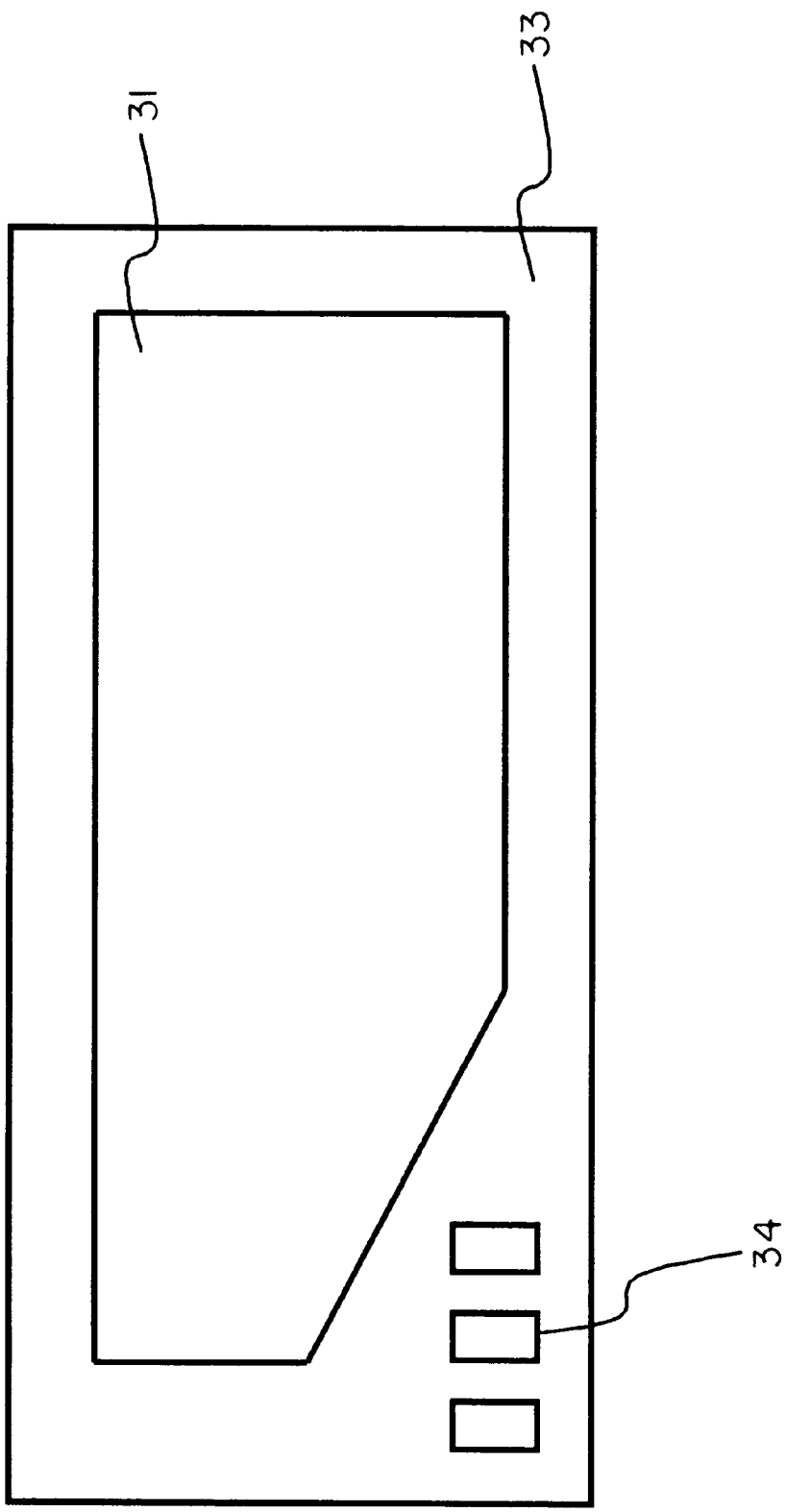
FIG. 4 is an illustration of a complementary wiring package made from a wasted portion of the base board of FIG. 3.

As illustrated in FIG. 4, three complementary wiring packages 33 are made by cutting the wasted portion 33 and then fitting the cut portions with external molded packages 34.

Figure 5:
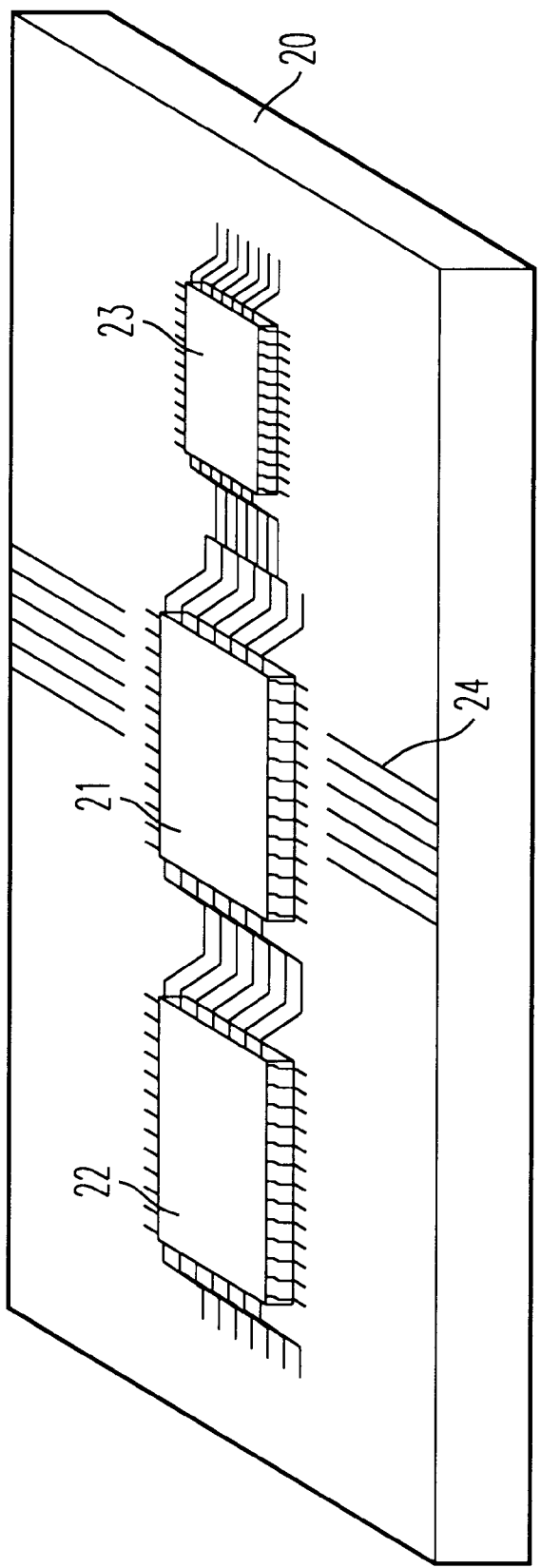
FIG. 5 illustrates a complementary wiring package that connects one semi-conductive integrated circuit package to another according to a third embodiment of the present invention.

If two IC packages are required to be connected with each other using a set of lines that overlap another set of lines, the wiring around the junction becomes very dense. In this case, the complementary wiring package 21 of FIG. 5 can be placed at the junction of two different sets of lines. As illustrated in FIG. 5, a printed wiring board 20 has a set of printed lines 24 thereon. For exemplary purposes, two semi-conductor integrated circuit (IC) packages 22 and 23 are shown mounted to the printed wiring board 20. The complementary wiring package 21 is placed over the set of printed lines 24 to connect the IC packages 22 and 23.

Figure 6:
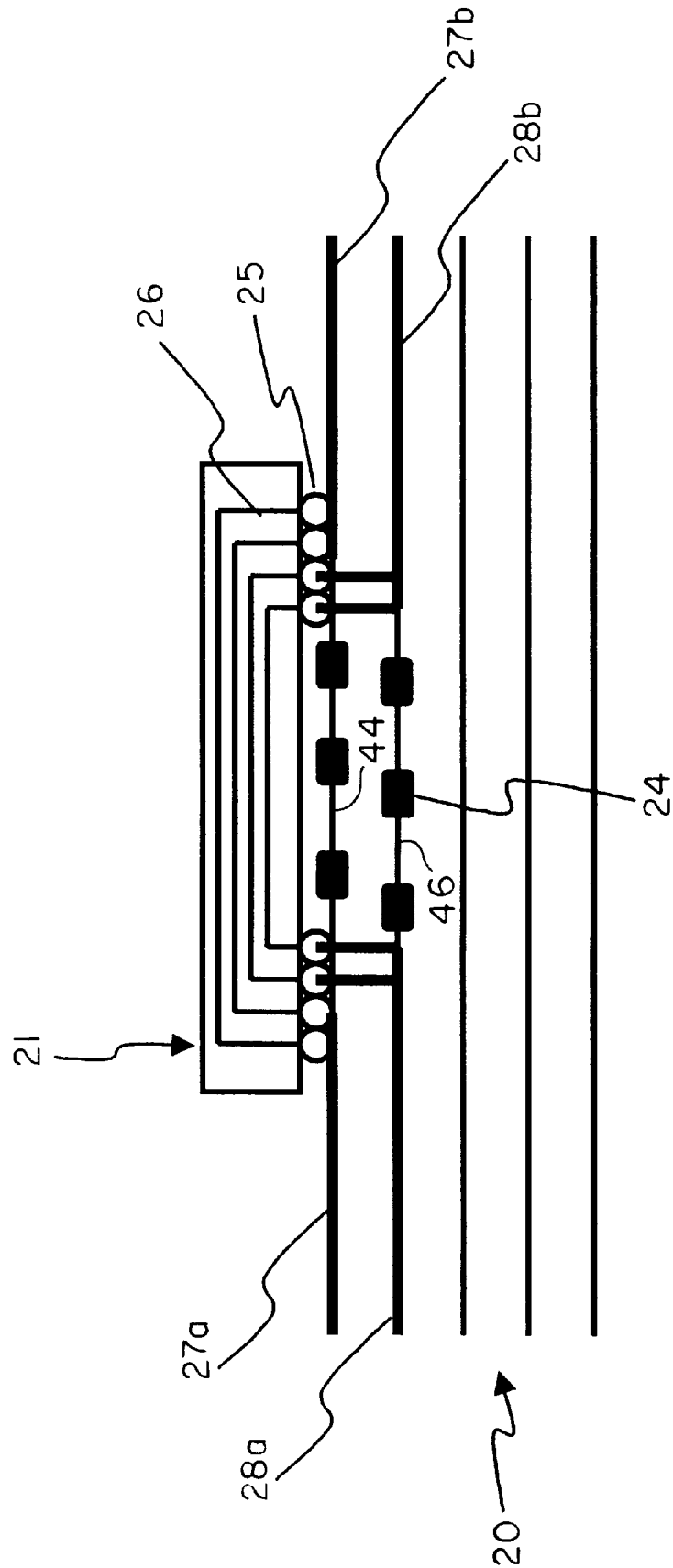
FIG. 6 is a sectional view of the complementary wiring package of FIG. 5.

As illustrated in FIG. 6, the complementary wiring package 21 includes external bumps 25 and internal lines 26. The internal lines of the complementary wiring package 21 connect a first line 27a to a second line 27b on a surface layer 44 and a third line 28a to a fourth line 28b on a second 46 layer of the board 20 in the horizontal direction. The set of printed lines 24 are disposed under the complementary wiring package 21.

In this way, the IC packages 22 and 23 can be mounted across the existing dense printed lines 24 on the board 20 without affecting the printed lines 24.

The above-described complementary wiring packages 21 has the following advantageous effects.

1. The complementary wiring package 21 can provide an additional layer to the printed wiring board so that the density of the wiring on the board can be reduced to some extent. The complementary wiring package includes no semi-conductor integrated circuit and can be fabricated in an easy and low cost manner.

2. The complementary wiring package 21 is made of the same glass epoxy material as the board and is not affected by heat contraction. Since the complementary wiring package is made from the unused portion of the board, it can be made in an easy and low cost manner.

3. The complementary wiring package uses a silicon material so as to easily handle precisely the internal wiring configuration.

4. The complementary wiring package can be designed in a space saving manner since all the external bumps are arranged only one surface thereof. Since the complementary wiring package is made from the unused portion by adding external bumps at the bottom surface, it can be made in an easy and low cost manner.

5. If the complementary wiring package has the external bumps only on a perimeter of the bottom surface thereof. Therefore, the complementary wiring package can be fabricated easily and inexpensively using conventional techniques.

6. The external bumps of the complementary wiring package may be formed using solder. Therefore, the complementary wiring package can be fabricated easily and inexpensively using conventional techniques.

7. The external leads of the complementary wiring package may be formed using an electrically conductive adhesive. Therefore, the complementary wiring package can be fabricated easily and inexpensively using conventional techniques, with less lead.

In addition, the entire IC mount structure illustrated in FIG. 4 has the following advantageous effects.

1. The structure can reduce the density of wiring on the board and, at the same time, provide a high density board since the complementary wiring package permits sets of wires to bypass, and thus avoid, densely wired portions of the board.

2. The structure can reduce the density of wiring on the board simply and inexpensively by increasing the number of layers only around a dense portion of the board using the complementary wiring package. With the conventional wiring methods the number of layers is increased throughout the entire board in order to reduce the density of wired portions. The embodiment according to the present invention can obviate such a problem without increasing the number of layers throughout the entire board.

3. The structure is free from the drawbacks of heat contraction effects because the complementary wiring package is made of the same glass epoxy material as the printed wiring board. Also, the structure can increase a number of layers around only a dense portion of the board simply and inexpensively by making the complementary wiring package using the wasted portion of the board.

Next, an example of a different IC mount structure on the printed wiring board using the above-described complementary wiring package is explained with reference to FIG. 7. As described earlier, the semi-conductor IC circuits are mounted on the printed wiring board in a very dense arrangement. Therefore, in many cases, wiring cannot possibly be designed to include desired spacing between the signal lines. As a result, it may not be possible to mount the complementary wiring package 21a as illustrated in FIGS. 5 and 6. The IC mount structure of FIG. 7 provides a space between the complementary wiring package 2 la and the printed wiring board 20 in order to generate an electrical insulating effect therebetween.

Figure 7:
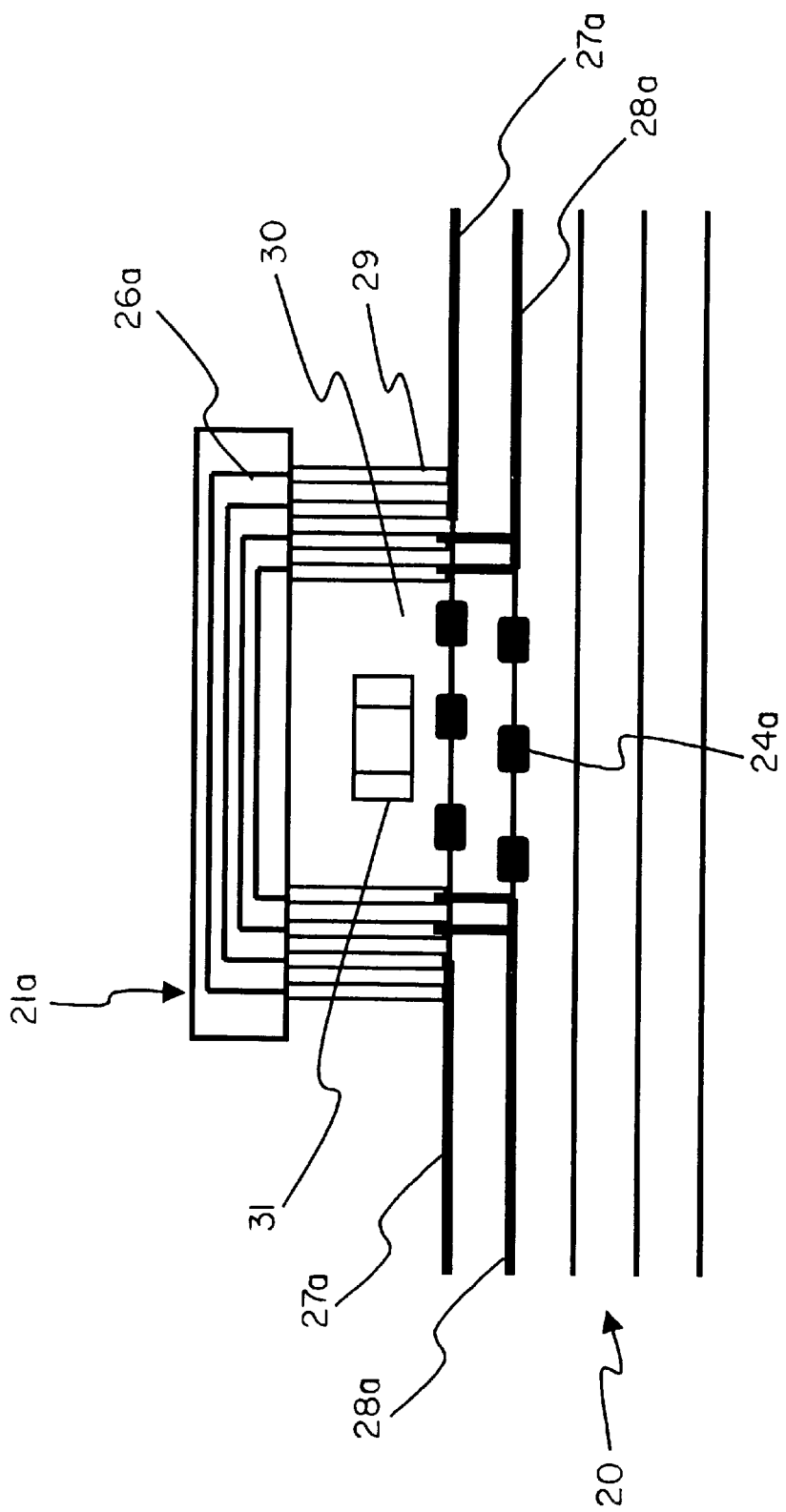
FIG. 7 is a sectional view of a complementary wiring package mounted on a printed wiring board according to a fourth embodiment of the present invention.

In order to make it possible to mount the complementary wiring package 21a for this purpose on a portion of the printed wiring board 20 that contains electrical components, the clearance between the complementary wiring package 21a and the printed wiring board 20 is made greater than the height of the electrical components 31 above the board, as illustrated in FIG. 7.

As shown by the IC mount structure of FIG. 7, the complementary wiring package 21a is covered with an external molded package. The IC mount structure includes different wiring 24a for connecting different circuits, a plurality of internal lines 26a, a second layer of lines 28a, a surface layer of lines 27a, a plurality of connecting members 29, a space for providing an electrical insulating effect, and an electrical component 31 mounted on the board 20.

Since the plurality of connecting members 29 are made higher than the height of the electrical component 31, the space 30 which is made between the complementary wiring package 21a and the electrical component 31 provides an electrical insulating effect. Thus, the complementary wiring package 21a can be positioned overtop the electrical component 31.

Next, exemplary variations of the IC mount structure illustrated in FIG. 7 are explained with reference to FIGS. 8 through 11.

Figure 8:
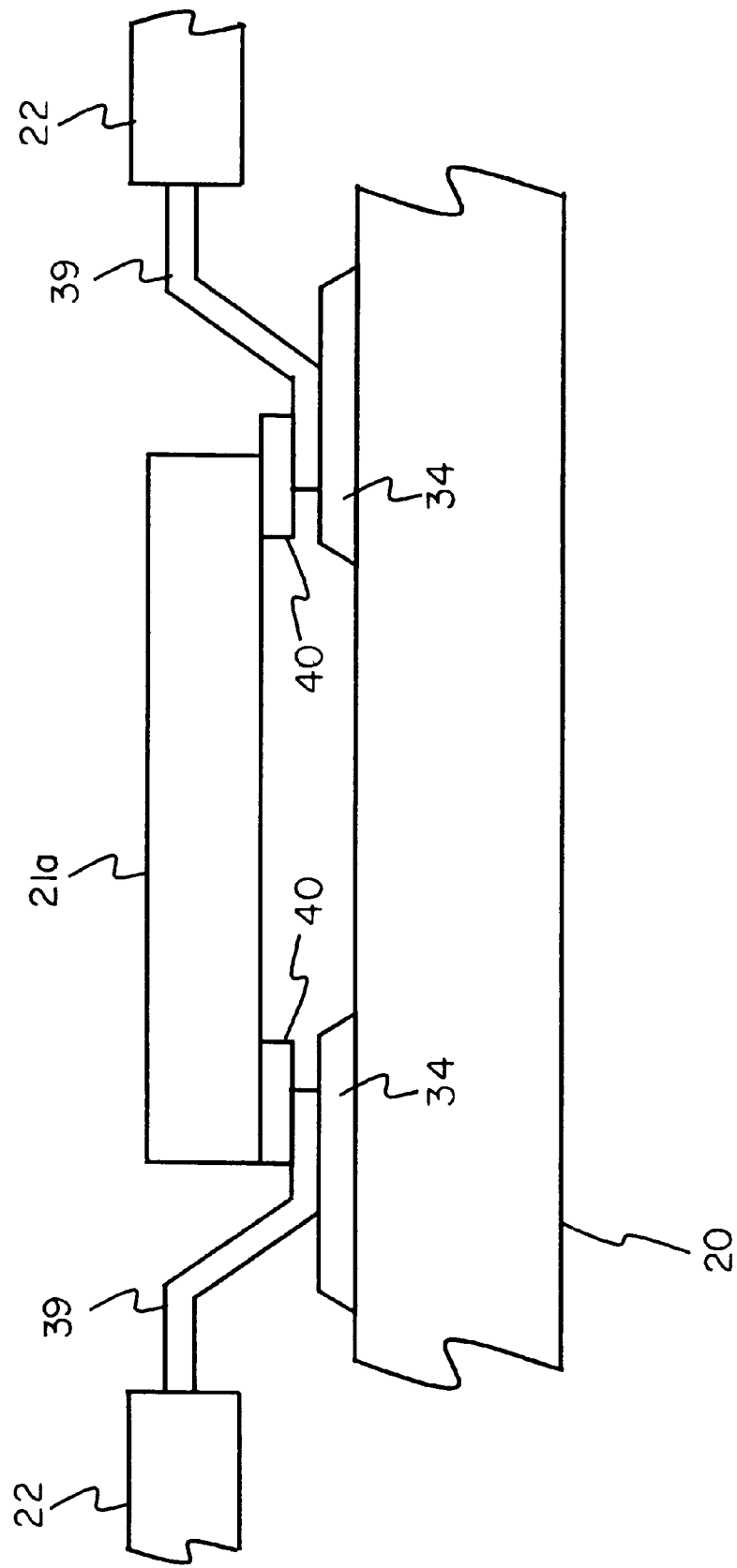
FIG. 8 illustrates the connection between the complementary wiring package of FIG. 7 and two semi-conductive integrated circuit packages, an insulating pad, and an external pin of the semi-conductive integrated circuit package.

FIG. 8 illustrates a first variation of the IC mount structure of FIG. 7, in which the complementary wiring package 21 a electrically connects to IC packages 22 and 23 directly. The leads 39 of the IC packages 22 and 23 provide connecting members for contacting the external bumps 40 of the complementary wiring package 21a. More specifically, external bumps 40, the leads 39 of the IC packages 22 and 23, and electrical insulating pads 34 are stacked on the printed wiring board 20 in this order. The stacked configuration creates a relatively great space between the complementary wiring package 21 a and the printed wiring board 20. With this configuration, special arrangements for electrically insulating the complementary wiring package 21a are not needed.

An IC package 35 having bent leads 36 is illustrated in FIGS. 9(a) and 9(b).

A high-density square chip 37, illustrated in FIGS. 10(a) and 10(b), is manufactured in an automated process and designed to be ready for flow and re-flow soldering. A highly stable metal-glaze is used for a resistor element of the square chip, in order to increase mechanical strength with the glass coating. The square chip 37 of FIG. 10(a) has dimensions from 1.0±0.05 mm to 6.3±0.2 mm in the horizontal direction and from 0.5±0.05 mm to 3.15±0.20 mm in the vertical direction. The square chip 37 of FIG. 10(b) has dimensions from 0.35±0.05 mm to 0.55±0.10 mm in the vertical direction. The square chip 37 has an electrode 38 on each side end. Each electrode 38 is a multi-layered electrode, including internal, intermediate, and external layers (not shown).

Since a zero-ohm square chip resistors are widely available, using such a resistor as the connecting member 29 of FIG. 7 is a simple, inexpensive, and safe way to implement the circuitry because the chip has a resistance of zero ohms.

Figure 11:
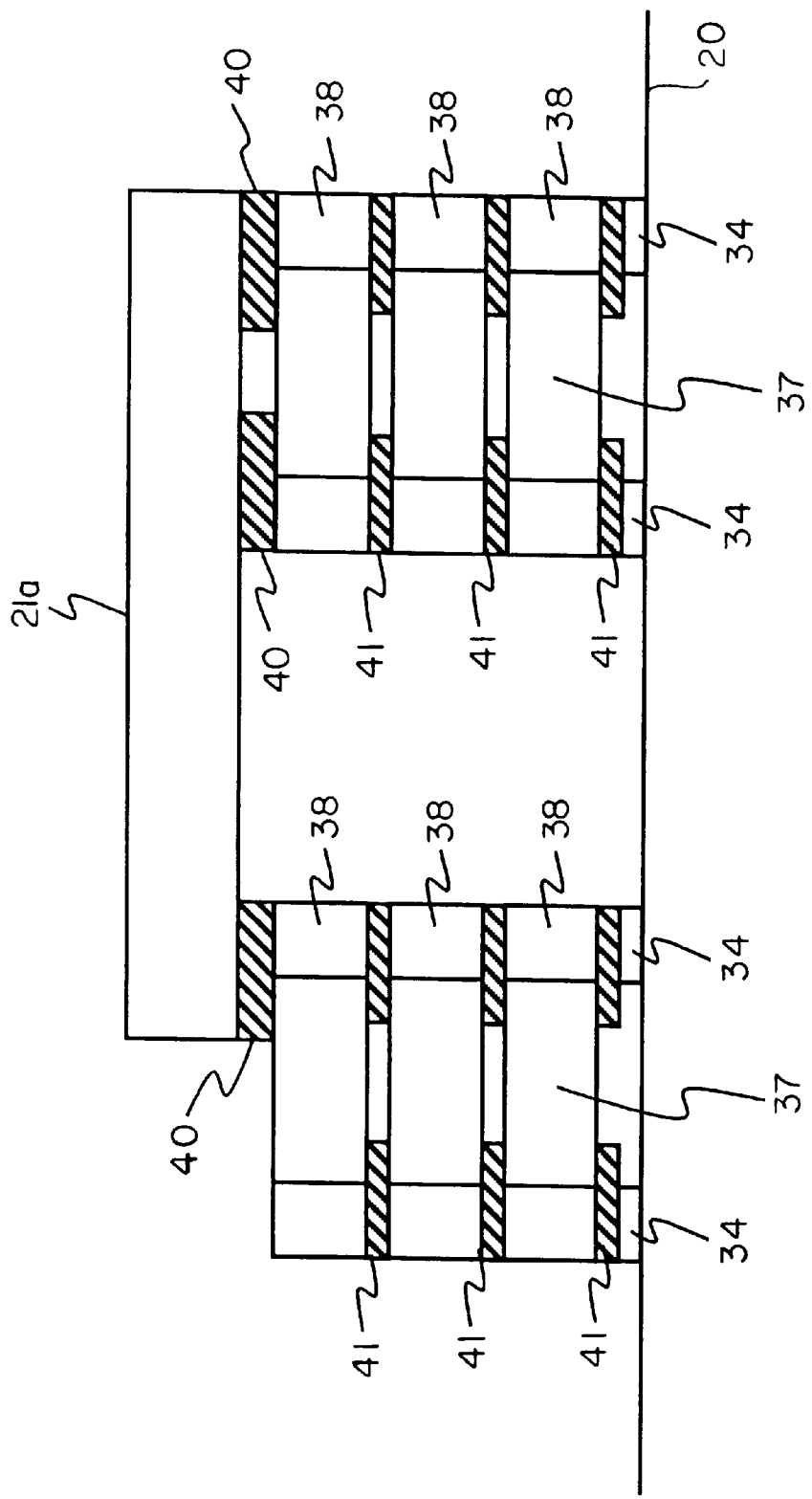
FIG. 11 illustrates an electrically insulating space under a complementary wiring package formed with a plurality of the square chip resistors.
Figures 12A, 12B, 12C:
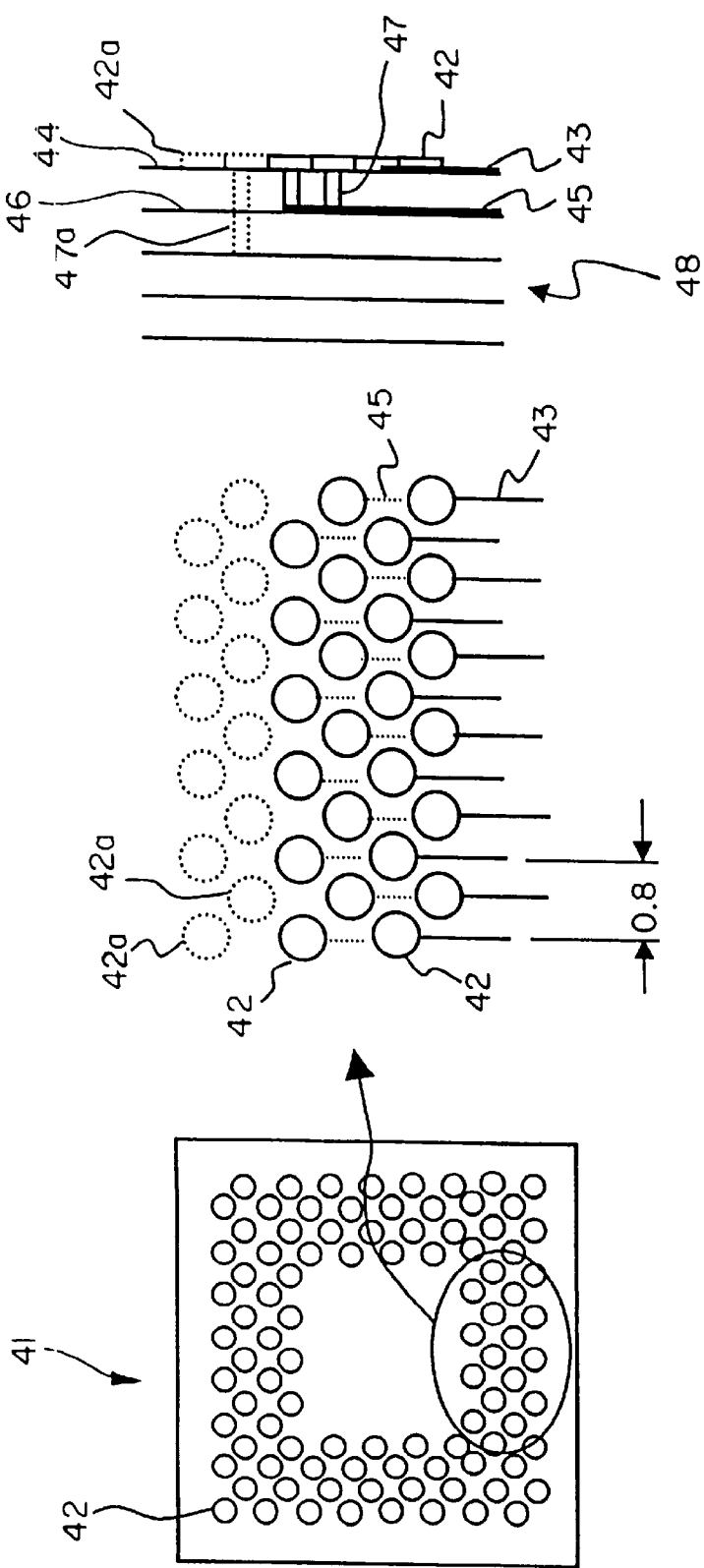
FIGS. 12(a), 12(b), 12(c) and 13 are illustrations of a prior art semi-conductive integrated circuit package that is not capable of having external pins in a central region on a top surface thereof.
Figure 13:
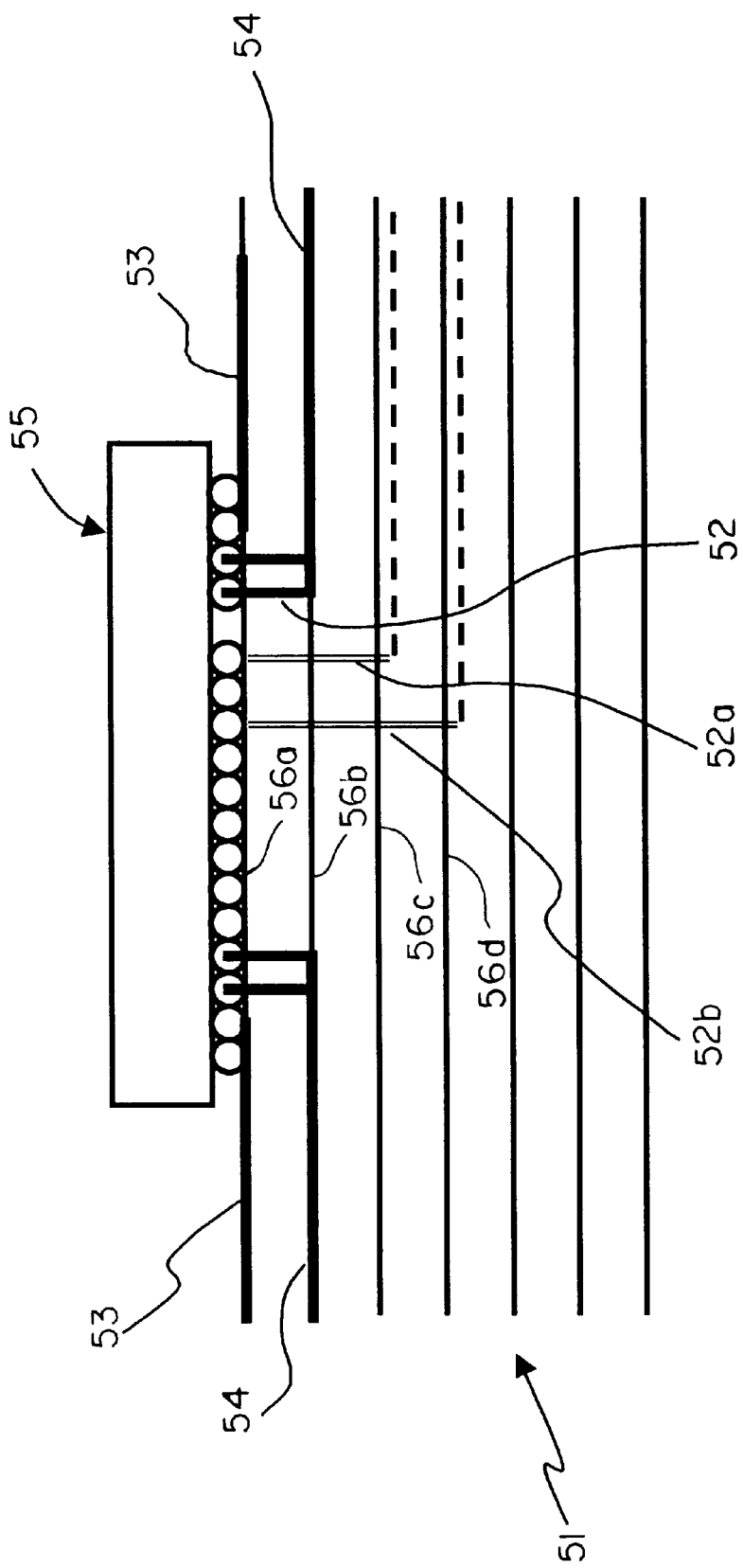

In addition, the square chip 37 can be implemented in the circuit illustrated in FIG. 11 such that only the electrodes 38 are used as the connection members 29. In this case, as the square chip 37 has two electrodes 38, many resources can be saved by a factor of two, including material costs, packaging space, packaging processes, and so forth.

As illustrated in FIG. 11, a plurality of the stacked connecting members 37 comprising electrodes 38 can make a space having a height equal to the height of each connecting member 37 multiplied by the number of stacked connecting members 37. Therefore, when the complementary wiring package 21 a is required to be mounted over a component fixed on the printed wiring board 20, the height required to bridge the component can easily be obtained by adjusting the number of connecting members 37.

FIG. 11 illustrates a structure in which three square chips 37 are stacked in order to make a relatively high connecting member. As shown, the three square chips 37 are stacked under the external bumps 40 of the complementary wiring package 21a. An inserter 41 is placed under each electrode 38 of the stacked square chip 37. An electrical insulating pad 34 is positioned between the bottommost of the inserters 41 and the printing wiring board 20. In this manner, a relatively large space can be made between the complementary wiring package 21a and the printed wiring board 20.

Obviously, numerous additional modifications and variations of the present invention are possible in light of the above teachings. It is therefore to be understood that within the scope of the appended claims, the present invention may be practiced otherwise than as specifically described herein.

In describing preferred embodiments of the present invention illustrated in the drawings, specific terminology is employed for the sake of clarity. However, the present invention is not intended to be limited to the specific terminology so selected and it is to be understood that each specific element includes all technical equivalents which operate in a similar manner.

This application is based on Japanese Patent Application Nos. JPAP09-156440 (filed in the Japanese Patent Office on Jun. 13, 1997) and JPAP09-286783 (filed in the Japanese Patent Office on Oct. 20, 1997), both of which are herein incorporated by reference in their entirety.

We claim:

1. A circuit structure comprising:
   a complementary wiring package; and
   a semi-conductor integrated circuit package coupled to said complementary wiring package via a plurality of corresponding through holes of a printed wiring board sandwiched between said complementary wiring package and said semi-conductor integrated circuit package,
   said complementary wiring package comprising
      a first set of external pins mounted on a central region of a top surface of said complementary wiring package in a vertical direction and connected to corresponding of said plurality of through holes,
      a second set of external pins mounted in a perimeter region of said complementary wiring package and connected to printed wiring of said printed wiring board, and
      a plurality of internal lines that connect said first set of external pins to said second set of external pins.

2. The circuit structure of claim 1, wherein said second set of external pins are mounted on side surfaces of said complementary wiring package in a horizontal direction.

3. The circuit structure of claim 1, wherein said second set of external pins are mounted on the top surface of said complementary wiring package in the vertical direction.

4. The circuit structure of claim 1, wherein said plurality of internal lines are made of a silicon material and said first and second sets of external pins are made of a material selected from the group consisting of solder and electrically conductive adhesive.

5. A circuit structure comprising:
   a printed wiring board having a top surface; and
   a complementary wiring package having a top surface and a bottom surface spaced apart from said top surface of said printed wiring board, said complementary wiring package comprising
      a first set of external pins vertically mounted on a first side of a perimeter region of the top surface of said complementary wiring package and connected to pins of a first semi-conductor integrated circuit package,
      a second set of external pins vertically mounted on a second side of the perimeter region opposite said first side and connected to pins of a second semi-conductor integrated circuit package, and
      a plurality of internal lines that connect said first set of external pins to said second set of external pins.

6. The circuit structure of claim 5, wherein said first and second sets of external pins comprise bumps.

7. The circuit structure of claim 6, wherein said bumps are made of a material selected from the group consisting of solder and electrically conductive adhesive.

8. The circuit structure of claim 5, wherein said first and second sets of external pins comprise leads.

9. The circuit structure of claim 5, wherein said plurality of internal lines are made of a material selected from the group consisting of glass epoxy and silicon.

10. A circuit structure comprising:
    a complementary wiring package; and
    a semi-conductor integrated circuit package coupled to said complementary wiring package via a plurality of corresponding through holes of a printed wiring board sandwiched between said complementary wiring package and said semi-conductor integrated circuit package,
    said complementary wiring package comprising
       first external connect means for respectively connecting to said plurality of through holes, said first external connect means being mounted on a central region of a top surface of said complementary wiring package in a vertical direction,
       second external connect means for connecting to printed wiring of said printed wiring board, said second external connect means being mounted on a perimeter region of said complementary wiring package, and
       internal connect means for connecting said first external connect means to said second external connect means.

11. The integrated circuit structure of claim 10, wherein said second external connect means is mounted on side surfaces of said complementary wiring package in a horizontal direction.

12. The integrated circuit structure of claim 10, wherein said second external connect means is mounted on the top surface of said complementary wiring package in the vertical direction.

13. The integrated circuit structure of claim 10, wherein said internal connect means comprise silicon material, and said first and said second external connect means are made of a material selected from the group consisting of solder and electrically conductive adhesive.

14. An integrated circuit structure comprising:
    a printed wiring board having a top surface; and
    a complementary wiring package having a top surface and a bottom surface spaced apart from said top surface of said printed wiring board,
    said complementary wiring package comprising
       first external connect means for connecting to external leads of a first semi-conductor integrated circuit package, said first external connect means being vertically mounted on a first side of a perimeter region of a top surface of said complementary wiring package,
       second external connect means for connecting to external leads of a second semi-conductor integrated circuit package, said second external connect means being vertically mounted on a second side opposite said first side on the perimeter region, and
       internal connect means for connecting said first external connect means to said second external connect means.

15. The circuit structure of claim 14, wherein said first and second external connect means comprise bumps.

16. The circuit structure of claim 15, wherein said bumps are made of a material selected from the group consisting of solder and electrically conductive adhesive.

17. The circuit structure of claim 14, wherein said first and second external connect means comprise leads.

18. The circuit structure of claim 14, wherein said internal connect means are made of a material selected from the group consisting of glass epoxy or silicon.

* * * * *